United States Patent [19]

Guckel et al.

[11] 4,234,361

[45] Nov. 18, 1980

[54] PROCESS FOR PRODUCING AN ELECTROSTATICALLY DEFORMABLE THIN SILICON MEMBRANES UTILIZING A TWO-STAGE DIFFUSION STEP TO FORM AN ETCHANT RESISTANT LAYER

[75] Inventors: Henry Guckel, Madison, Wis.; Steven T. Larsen, Albany, Oreg.

[73] Assignee: Wisconsin Alumni Research Foundation, Madison, Wis.

[21] Appl. No.: 54,815

[22] Filed: Jul. 5, 1979

Related U.S. Application Data

[60] Division of Ser. No. 944,637, Sep. 21, 1978, which is a continuation of Ser. No. 739,583, Nov. 8, 1976, abandoned.

[51] Int. Cl.³ .............. H01L 21/223; H01L 21/225; H01L 21/306; H01L 29/06
[52] U.S. Cl. ...................... 148/186; 29/580; 29/610 S G; 148/175; 148/187; 148/188; 148/189; 156/628; 156/648; 156/657; 156/662; 338/2; 338/4; 357/4; 357/26; 357/55; 357/60
[58] Field of Search ............... 148/175, 186–188, 148/189; 29/580,610 SG; 156/628, .647, 648, 649, 657, 662; 357/26, 60, 55; 137/827, 831; 73/777; 338/2, 4

[56] References Cited

U.S. PATENT DOCUMENTS

| | | | |
|---|---|---|---|
| 3,397,278 | 8/1968 | Pomerantz | 174/52 |
| 3,440,873 | 4/1969 | Eichelberger | 357/26 X |
| 3,614,678 | 10/1971 | Engeler et al. | 333/72 |
| 3,634,727 | 1/1972 | Poyle | 357/26 |
| 3,676,231 | 7/1972 | Medvecky et al. | 148/188 |
| 3,697,918 | 10/1972 | Orth et al. | 338/3 |
| 3,721,593 | 3/1973 | Hays et al. | 156/628 |
| 3,751,314 | 8/1973 | Rankel | 148/188 X |
| 3,758,830 | 9/1973 | Jackson | 357/26 X |
| 3,806,382 | 4/1974 | Fitzgibbons et al. | 148/188 |
| 3,814,998 | 6/1974 | Thoma | 73/718 |
| 3,826,865 | 7/1974 | Quate et al. | 178/7.1 |
| 3,886,584 | 5/1975 | Cook et al. | 357/23 |
| 3,900,811 | 8/1975 | Kurtz et al. | 338/2 |
| 3,918,019 | 11/1975 | Nunn | 338/2 X |
| 3,929,528 | 12/1975 | Davidson et al. | 148/175 |
| 3,938,175 | 2/1976 | Jaffe et al. | 357/26 |
| 3,944,732 | 3/1976 | Kino | 178/7.1 |
| 3,949,246 | 4/1976 | Lohrmann | 310/8.6 |
| 3,952,234 | 4/1976 | Birchall | 317/246 |
| 3,966,515 | 6/1976 | Guthrie | 148/188 |
| 4,103,273 | 7/1978 | Keller | 29/580 X |

FOREIGN PATENT DOCUMENTS

| | | |
|---|---|---|
| 1177320 | 1/1970 | United Kingdom ............... 148/188 X |
| 1211499 | 11/1970 | United Kingdom . |
| 1235077 | 6/1971 | United Kingdom . |
| 1399988 | 7/1975 | United Kingdom . |

OTHER PUBLICATIONS

Greenwood, J. C., "Ethylene Diamine–Catechol–Water—Etching of p-n Junction", J. Electrochem. Soc., vol. 116, No. 9, Sep. 1969, pp. 1325–1326.
Smith et al., "X-Ray Lithography—Electron Beam—", J. Vac. Science Technology, vol. 10, No. 6, Nov./Dec., 1973, pp. 913–917.
Schmidt et al., "Preparation of Thin Windows in Silicon—Lithography", J. Applied Physics, vol. 46, No. 9, Sep. 1975, pp. 4080–4082.
Huang et al., "Schottky Diodes—on Thin Silicon Membranes". IEEE Trans. on Electron Devices, vol. ED-23, No. 6, Jun. 1976, pp. 579–583.
Huang et al., "Single-Crystal Silicon-Barrier Josephson Junctions", IEEE Trans. on Magnetics, vol. Mag-11, No. 2, Mar. 1975, pp. 766–769.
Moore et al., "Auger Investigation of Boron-Doped $SiO_2$/Li", J. Vac. Sci. Tech., vol. 14, No. 1, Jan./Feb. 1977, pp. 70–74.
Finne et al., "Water-Amine—System for Etching Silicon", J. Electrochem. Soc., vol. 114, No. 9, Sep. 1967, pp. 965–970.
Bohg, A., "Ethylene Diamine—Boron-Doped Silicon", J. Electrochem. Soc., vol. 118, No. 2, Feb. 1971, pp. 401–402.

*Primary Examiner*—R. Dean
*Assistant Examiner*—W. G. Saba
*Attorney, Agent, or Firm*—Isaksen, Lathrop, Esch, Hart & Clark

[57] ABSTRACT

The invention relates to thin silicon membranes formed in layers of silicon such as are normally utilized as substrates in the manufacture of integrated electronic circuits. The thin membranes constructed in accordance with the invention are capable of deformation by electrostatic forces and are applicable to a wide range of uses including the manufacture of solid state pressure sensors, resonant, and antenna structures, as well as electro-optical display elements. A processing technique is disclosed which is particularly adapted to forming membranes in silicon substrates in a manner which is compatible with the construction thereon of other integrated circuit components. The process involves a short and concentrated deposition diffusion of boron into one of the surfaces of the substrate, followed by rapid and substantially oxygen and water vapor free transfer of the substrate to a drive furnace which is oxygen and water vapor free in which diffusion to a preselected depth takes place over a controlled period of time.

10 Claims, 12 Drawing Figures

PROCESS FOR PRODUCING AN ELECTROSTATICALLY DEFORMABLE THIN SILICON MEMBRANES UTILIZING A TWO-STAGE DIFFUSION STEP TO FORM AN ETCHANT RESISTANT LAYER

REFERENCE TO RELATED APPLICATION

This is a division of application Ser. No. 944,637, filed Sept. 21, 1978, which application is a continuation in part of application Ser. No. 739,583, filed Nov. 8, 1976, now abandoned.

BACKGROUND OF THE INVENTION

The invention relates to monocrystalline silicon diaphragms which by virtue of their electrostatic deformation capability are applicable in a wide range of uses.

In the manufacture of integrated circuits and integrated electronic devices wherein a substrate of semiconductor material such as silicon is utilized, devices which behave as inductors which are compatible with the substrate material have long been sought. No satisfactory method has previously been achieved, thus requiring the use of large scale or discrete components in conjunction with integrated circuits. The elimination of such discrete components would therefore be valuable in both the reduction of the size as well as the weight of circuits requiring inductive behaving devices. The high cost of manufacturing such hybrid circuits is a result of the manufacturing step of adding or attaching the discrete components to the integrated circuits which have already been mechanized by integrated circuit techniques; the elimination of such a step may therefore considerably reduce the cost of manufacturing such circuits.

Silicon and other semiconductor membranes of thin section have been known in the art, but it has not been heretofore discovered that the electrostatic deformation of such membranes having certain dimensions enable them to be utilized as a variable capacitance, as an electromechanical resonator (by means of the superimposition of an AC voltage upon a DC bias for creation of the electrostatic force) or for other applications wherein a small controllable or resonant movement of a diaphragm is useful.

In the prior art, for example, thin silicon diaphragms have been used as pressure sensors, but such devices have generally been manufactured in such a fashion as to form a configuration of strain gauge elements. Such an application is taught in the U.S. Pat. No. 3,697,918 to Orth et el. U.S. Pat. No. 3,814,998 to Thoma et al. shows the silicon membranes which are utilized to form a sandwich with a dielectric core; the decrease of the thickness of the inner dielectric core changes the capacitance of the sandwich. However, in none of the prior art which has contemplated the use of silicon membranes has it been recognized that the application of electrostatic attraction forces between a thin silicon membrane formed in a silicon wafer and an electrode of opposite polarity can induce both movement and electromechanical resonance.

The present invention, however, contemplates structures which are capable of exhibiting resonant behavior as well as controlled deflection in response to external forces. These structures enable the construction of improved pressure transducers, electro-optical display devices, electromechanical resonant devices such as tank circuits, and inductive devices, all of which are capable of mechanization on the same substrate as integrated circuits as conventionally manufactured and by techniques which are compatible with present integrated circuit manufacture.

Known procedures for forming thin membranes in silicon substrates require a lengthy deposition diffusion of an impurity into a portion of the substrate to a desired depth. For example, boron is known to provide etchant resistant properties when diffused into silicon above certain concentration levels. The typical procedure for forming an etchant resistant layer with this type of impurity is to diffuse boron from a gas ambient into a portion of the silicon substrate. To achieve an etchant resistant layer 1 to 3 microns thick having sufficient boron concentration to resist specific silicon etchants, it has been necessary to retain the silicon substrate in the diffusion furnace for long periods of time, in the range of 3 hours or more. A surface phase is inevitably formed on the surface of the substrate which is primarily a boro-silicate glass, i.e., a mixture of boron oxide and silicon dioxide. The boro-silicate glass is generally removed before further processing is performed on the substrate. Such procedures are incompatible with the formation of further integrated circuit components on the silicon slab, since the long deposition diffusion time required allows the boron to penetrate an oxide mask in other areas of the substrate. As a result, there will exist unwanted levels of boron impurities which can interfere with the construction of semi-conductor devices on the substrate.

SUMMARY OF THE INVENTION

In accordance with the present invention, and particularly in accordance with the preferred embodiments illustrated in the following specification, thin membranes constructed on the order of a micron in thickness can be produced by selectively etching the surfaces of silicon wafers. Such membranes are capable of physical deflection in response to the application of electrostatic forces on them.

Thin membranes are formed in a silicon substrate in a manner which minimizes the introduction of unwanted impurities in areas of the substrate other than that in which the membrane is to be formed. The process involves a short and concentrated deposition diffusion of boron into one of the surfaces of the substrate, followed by rapid and substantially oxygen and water vapor free transfer of the substrate to a drive furnace in which diffusion to the selected depth takes place over a controlled period of time. Oxygen and water vapor are substantially excluded from the drive furnace. We have determined that only a relatively thin borosilicate glass layer is formed on the substrate during the deposition diffusion, and that, under the conditions mentioned above, this glass layer deteriorates during the drive diffusion such that it does not exert appreciable strain on the underlying silicon membrane. With such processing, membranes in larger silicon substrates may be formed to precisely controlled thicknesses with nearly 100% yield, while leaving the remainder of the substrate substantially free of boron impurities.

BRIEF DESCRIPTION OF THE DRAWINGS

A more complete understanding of the invention, especially various features, objects and advantages thereof, may be obtained from the following detailed description when taken in conjunction with the drawings in which.

DESCRIPTION OF THE PREFERRED EMBODIMENTS

Silicon membranes or thin diaphragms manufactured and utilized in accordance with the present invention are typically on the order of a micron in thickness and may be produced by selectively etching one or more surfaces of a thin wafer of silicon of the type generally utilized for substrates of integrated circuits. In a preferred method, wafers can be prepared by means of diffusing boron into one surface thereof to a depth corresponding to the thickness desired for the particular diaphragm or membrane. The other side of the wafer may then be etched away in a pattern devised by conventional integrated circuit preparation and manufacturing techniques. It has been found that the diffused boron in the silicon forms a barrier to the etching process which enables the thickness of the diaphragm to correspond to the depth of diffusion of the boron in the wafer. Although not restricted to the use of boron, boron or another suitable substance may be useful for retarding the particular etch used and may be introduced into the silicon wafer by other well known techniques such as epitaxial growth or ion implantation. Many conventional techniques exist for the selective etching away of silicon material to a desired depth, and are appropriate. One that has been utilized and found suitable will be described in an example of an experimental embodiment below.

Figure 1:
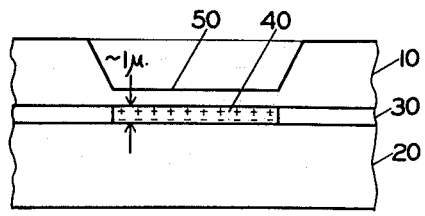
FIG. 1 shows a generalized configuration of a diaphragm made in accordance with the present invention capable of electrostatic deflection and electromechanical resonance.

Diaphragms or membranes produced in the above described manner are useful for the creation of several forms of devices. One form of device which has a large range of uses employs a silicon diaphragm according to the invention as one plate of a capacitive device. Although many other forms of conductors may be used to form a second plate or second electrode, an embodiment is shown in FIG. 1 which utilizes a second silicon wafer as the second conductor or plate of a capacitor. In the structure shown in FIG. 1, a one micron thick silicon dioxide layer 30 is sandwiched between two silicon wafers 10 and 20. The first or upper silicon layer 10 has formed in it a one micron thick diaphragm 50 in accordance with the techniques already suggested. Immediately below the diaphragm a portion of the silicon dioxide layer has been selectively removed so as to form a cavity or chamber 40 between the diaphragm 50 and the second or lower silicon wafer 20. Such a cavity is of course necessary so that the proper and desired range of movement of the diaphragm 50 may be effected. The diaphragm of the first silicon wafer 10 and the second silicon wafer 20 separated by the oxide layer 30 form a capacitor across the chamber. Such a structure of the diaphragm 50 and the second or lower wafer 30 form two plates of the capacitor.

Since the structure shown in FIG. 1 creates a capacitance and since the thin membrane 50 is deformable under the application of electrostatic and other forces, the particular structure may be utilized as a sensor. For example, in response to forces on the diaphragm in FIG. 1, the diaphragm 50 may itself be deformed, causing a change in the spacing of the diaphragm 50 in relation to the lower silicon wafer or layer 20. In this manner, the relative spacing of the "plates" causes a change in the overall capacitance of the device. Deforming forces may be generated by the expansion of a gas under thermally changing conditions, as a response to the pressure of acoustic waves or other forces sufficient to cause the deformation of the diaphragm 50. Thus, the diaphragm 50 may be utilized as a force, temperature or pressure transducer wherein the measured quantity may be related to capacitance changes. With the particular structure shown in FIG. 1, many force-generating phenomena under investigation may be quantized in terms of capacitance variation.

In addition to the above-described direct mechanical transducive aspect of the structure shown in FIG. 1, the particular structure illustrated also exhibits electrostatic phenomena capable of broad utilization. By placing a DC bias potential across both the upper (10) and lower (20) silicon wafers, a charge pattern is caused to form on the lower surface of the diaphragm 50 and the upper surface of the lower silicon wafer exposed to the chamber 40 etched in the silicon dioxide layer 30. Such a charge pattern causes electrostatic attraction between the diaphragm 50 and the lower silicon wafer 20. In certain voltage ranges such electrostatic attraction will be sufficient to cause a measurable and substantially linear physical deformation of the diaphragm.

Figure 2:
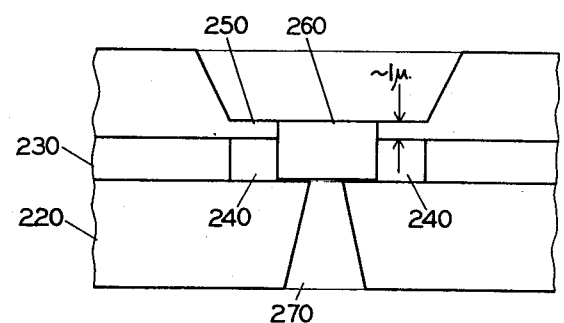
FIG. 2 shows a particular embodiment of a valve utilizing a thin silicon diaphragm constructed in accordance with the present invention.

This mechanical motion may be exploited in the creation of valves such as shown in FIG. 2 that may be opened or closed in response to the application of a DC voltage between a diaphragm 250 and a lower silicon layer 220. In the structure of FIG. 2, a diaphragm 250 has formed integral with it a cap or valve 260, which in response to deformation of the silicon membrane 250, is caused to seal an orifice 270 formed in lower silicon layer 220. Also, because deflections are extremely controllable by means of variation in bias voltage as the accompanying table has shown, by use of suitable means in controlling the electrostatic charge on the plates, the device may be utilized as an extremely accurate micropositioner.

A particular advantage to the structure shown in FIG. 1 is that it is capable of exhibiting resonant behavior if, in addition to a DC bias, the diaphragm 50 is excited by an AC voltage. Because the heretofore described mechanical deformations induced by the electrostatic charge formed on the surface of the layer 20 and diaphragm 50 can induce mechanical resonance of the diaphragm, electrical energy applied to the structure shown in FIG. 1 as a voltage between layers 10 and 20 is therefore capable of causing and sustaining mechanical resonance of the diaphragm 50. At such frequencies the resonating mechanical diaphragm acts as an energy storage element for electrical energy like a tuned circuit. Such resonant behavior is analogous to that of a quartz crystal and the macroscopic behavior of the device of the invention exhibits circuit behavior at its terminals substantially as does an electrical capacitive-inductive resonant tank circuit.

Figure 3:
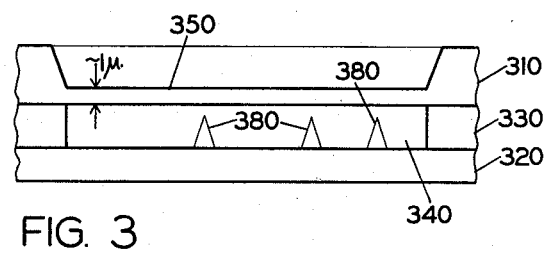
FIG. 3 shows a particular embodiment utilizing the diaphragm according to the invention for the formation of a selectably tunable tank circuit.

Because the process of manufacturing a diaphragm in accordance with the present invention is compatible with integrated circuit manufacturing techniques applied to the same silicon wafer, the manufacture of filters, oscillators and tuners which embody or require resonant tank circuits is therefore possible on an integrated circuit basis. One example of a use exploiting the resonant behavior of the diaphragm according to the invention under alternating current excitation is shown in FIG. 3. FIG. 3 shows an arrangement made from silicon wafers or wafer segments of a solid state silicon crystal; and which is capable of being tuned to predetermined multiple frequencies. The device thus forms an integral solid state tuner. This device, as shown, incorporates individually doped pyramids of silicon 380 displaced at various lengths along a lower silicon wafer 320. Voltages placed on an individual doped silicon pyramid may be useful in causing the electrostatic deflection of an upper silicon diaphragm 350 in an upper silicon layer 310 into contact with a particular energized pyramid 380. Of course, the layers 310 and 320 are separated by a silicon dioxide layer 330. By selectively energizing particular individual pyramid structures 380, an appropriate resonant length of the diaphragm 350 may be selected. Also, imposition of an AC excitation on the structure shown in FIG. 3 between the upper 310 and lower 320 silicon layers, causes resonance of the diaphragm 350 to be preselected and the device can thus act as a "tuned" tank at particular frequencies.

Because the resonant displacement of electrostatically charged diaphragms in accordance with the invention involves the movement of an electrical charge pattern at a particular frequency, the diaphragms, and particularly oscillating diaphragms, may be useful for sources for the radiation and propagation of electromagnetic signals. The diaphragm structures may therefore be extremely useful in the creation of small scale antennas which may be formed in integrated circuits along with associated circuitry. It is also apparent that the frequency at which the diaphragm may resonate is a function of external forces acting on the diaphragm. Thus, a resonating device according to the invention can therefore be used to monitor or transduce such forces. The resonance of such structures can be controlled externally by the application of external direct current energy allowing for the creation of the DC tunable filter and that the resonance of the device may be altered by a particular DC bias level on the diaphragm. Forces acting on the diaphragm other than the electrostatic force may also include forces generated by pressure, forces by temperature change of a gas, or by the acceleration of a mass allowing the creation of devices such as accelerometers, temperature and pressure transducers. Of course, each of the structures indicated above are compatible with integrated circuit processing techniques.

In order to guide those skilled in the art in the fabrication and use of the diaphragms according to this invention, the following description sets forth exemplary methods and techniques for construction of the diaphragms together with examples of devices which have been produced experimentally in accordance with the present invention.

Diaphragms in accordance with the invention are constructed from thin silicon wafers of the type which are generally utilized to provide substrate material in the manufacture of integrated circuits. The diaphragms are prepared by first diffusing an etchant-retarding substance such as boron into the wafer to a depth corresponding to the thickness desired for the resulting diaphragm. The surface of the wafer opposite that into which the diffusion of etchant-retardant has been effected may be subsequently masked for the application of etchant so that a diaphragm of appropriate size may be constructed. An etching process found to be suitable is described in Volume MAG-11, IEEE Transactions on Magnetics, Mar. 2, 1975, in an article entitled "Single Crystal Silicon Barrier Josephson Junctions," p. 766, by C. L. Huang and T. Van Duzer.

Figure 4:
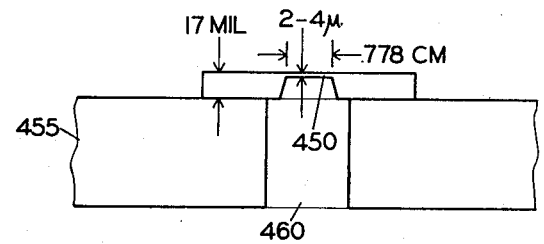
FIG. 4 illustrates a construction utilized to determine the deformation of a diaphragm.

Typical diaphragm configurations are on the order of 0.8 cm square, i.e., 0.8 cm on a side and of a thickness of 2 to $4\mu$ (microns). Experimental testing has revealed that such diaphragms respond to force in a substantially linear manner. For example, in one experiment, a diaphragm of the general configuration (0.8 cm square, $2.4\mu$ thick) described was wax mounted on a polished steel plate such that a hole cut in the plate was aligned directly under the diaphragm as shown in FIG. 4. By connecting a tubing fitting to the side of steel plate 455 opposite the diaphragm 450, it was possible to use a water manometer to apply static pressure to the diaphragm by means of aperture 460 in plate 455. This static pressure, applied to the back side of diaphragm 450, was able to cause transverse deflection of the diaphragm. This deflection was measured by placing the assembly of plate 455 and diaphragm 450 under microscope observation and using the change in focus at 400X magnification with a dial gauge on the fine focus adjustment. The dial gauge was graduated in division of 0.0001 in., and a maximum transverse deflection to an applied pressure differential ratio of $0.5\mu$ per 100 dyne/cm$^2$ was measured with linearity being maintained for deflections up to $8\mu$. Deflections over $15\mu$ with pressures over 3000 dyne/cm$^2$ were applied without rupturing the diaphragm. The deflections for applied pressure differential is given in Table A below for this experiment.

TABLE A

| Applied pressure differential in cm H$_2$O | Deflections in mils |
|---|---|
| 0 | 0 |
| 0.20 | 0.15 |
| 0.30 | 0.30 |
| 0.40 | 0.40 |
| 0.55 | 0.50 |
| 0.70 | 0.55 |

TABLE A-continued

| Applied pressure differential in cm H₂O | Deflections in mils |
|---|---|
| 0.85 | 0.65 |
| 1.10 | 0.75 |
| 1.20 | 0.80 |
| 1.35 | 0.85 |
| 1.55 | 0.95 |
| 1.85 | 1.00 |
| 2.05 | 1.05 |
| 2.35 | 1.15 |
| 2.75 | 1.25 |

Figure 5:
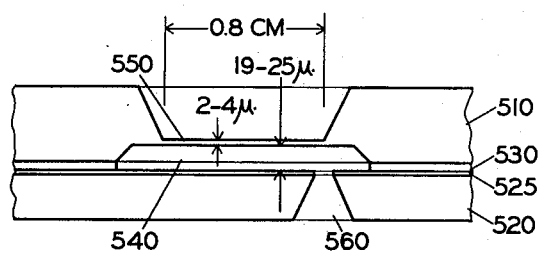
FIG. 5 illustrates a construction of the invention utilized for exhibiting electrostatic deformation of a diaphragm.

In another experiment, a square silicon diaphragm 0.8 cm on a side was recessed 19μ from the polished surface of the silicon wafer by relief etching of the silicon, and was mounted on a second silicon wafer on which aluminum had been evaporated, as is illustrated in FIG. 5. In the drawing, number 550 indicates the diaphragm, 510 the silicon layer in which diaphragm 550 is formed, 520 the lower wafer, 525 the aluminum layer evaporated on wafer 520, 530 a SiO₂ layer separating the upper wafer 510 from aluminum layer 525, and 560 a relief port etched in wafer 520. Relief port 560 is approximately 1 mm. square, providing gas relief to chamber 540, formed between diaphragm 550 and aluminum layer 525, so that no pressure differential would exist across diaphragm 550.

A bias voltage of 50 v was applied between layers 510 and 520, resulting in a maximum transverse deflection of approximately 2μ. Application of a 40 v DC bias with an 80 v peak-to-peak AC sinusoidal voltage superimposed at 1 Hz resulted in transverse deflection changes of a least 6μ. The application of about 20 v peak-to-peak AC sine wave voltages at higher (1 Hz to 100 kHz) frequencies failed to result in any noticeable resonance peak characteristics because of the effect of air damping, but at frequencies of about 4 kHz, the motion of the diaphragm produced an audible acoustic wave with the intensity of the sound increasing sharply with the simultaneous application of a DC bias voltage of about 40 v. The acoustic signal from the diaphragm was audible for frequencies up to the human hearing limit at about 18 kHz.

Figure 6:
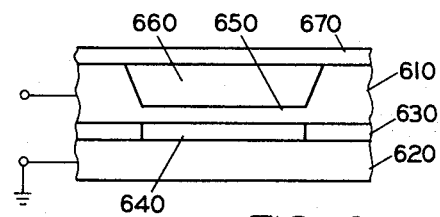
FIG. 6 shows an electro-optical display cell utilizing a thin silicon diaphragm made in accordance with the invention.

FIG. 6 shows an additional embodiment of the invention wherein a diaphragm in accordance with the invention is utilized in the creation of optical display elements. The device shown in FIG. 6 employs a diaphragm 650 formed in a layer 610 of silicon. Layer 610 is separated from a second silicon layer 620 by a silicon dioxide (SiO₂) layer 630, partially etched to provide an open chamber 640 immediately beneath diaphragm 650. Additionally, a transparent layer 670 is bonded to the upper surface of layer 610 so as to create a second open chamber 660 between diaphragm 650 and layer 670. The layer 670 may be of any transparent solid material; one such suitable material may be Pyrex.

The display element illustrated in FIG. 6 may be operated by placing a voltage between layers 610 and 620 sufficient to cause deformation of the diaphragm 650. This deformation changes the distance or relative spacing between diaphragm 650 and Pyrex layer 670, changing the optical constructive interference of incoming radiation and thus changing the optical characteristics of the device in a visually detectable manner. An array of such devices may thus form an electrostatically controllable display, wherein the degree of constructive interference for each diaphragm is readily controllable by variation of the electrostatic deformation of the diaphragms. Multicolored displays utilizing such devices are thus possible.

In all of the embodiments shown, it is necessary that an even, flat bond be effected between the silicon layer in which the diaphragm is formed and the silicon dioxide layer which separates the silicon layers or wafers. One technique which may be suitable is described in the Journal of Applied Physics, V. 40, No. 10, 1969, p. 3946, "Field Assisted Glass-Metal Sealing," by G. Wallis and D. I. Pomerantz.

Figure 7:
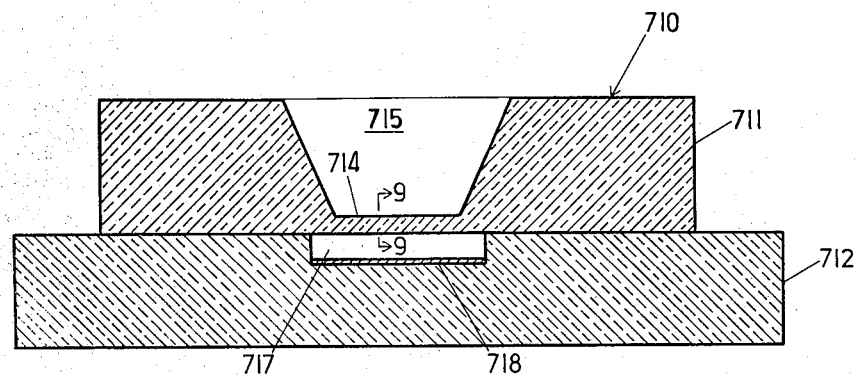
FIG. 7 is a cross-sectional view of another embodiment of a device in accordance with the invention, having a membrane formed in a silicon substrate over a cavity formed in a glass base.

A further example of a device in accordance with our invention is shown generally at 710 in FIG. 7. The device consists of an upper substrate of crystalline silicon 711 bonded to a lower substrate 712 of Pyrex type boro-silicate glass. A thin membrane 714 is formed under a cavity 715 in the silicon substrate. A cavity 717 is formed in the Pyrex substrate 712 underneath the diaphragm 714. A layer 718 of conductive metal such as aluminum is deposited on the bottom of the cavity 717.

Exemplary dimensions for the device 710 include a silicon substrate one by two centimeters on a side and a thickness of approximately 10 mils, with a substantially square central membrane being formed therein having dimensions approximately 0.8 centimeters on a side and a thickness of approximately 2 microns. The air gap between the bottom of the membrane 714 and the conducting metal 718 is approximately 8 microns. The relative dimensions of the parts have been greatly exaggerated in FIG. 7 for purposes of illustration.

Figure 8:
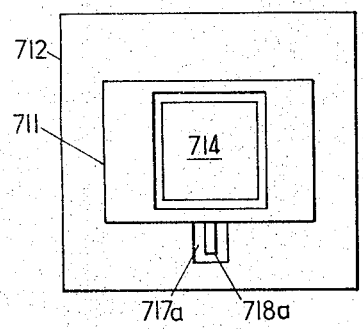
FIG. 8 is a top view of the device of FIG. 7.
Figure 10:
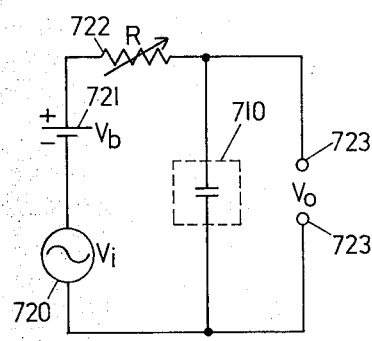
FIG. 10 is a schematic view of a circuit employing the device of FIG. 7 as an element thereof.

A top view of the device 710 is shown in FIG. 8. A portion 717a of the cavity 717 extends outwardly beyond the edges of the silicon substrate 711 to allow access to a lead 718a extending from the conducting metal layer 718. The lead 718a may be connected to external circuitry (not shown in FIG. 8). The substrate 711 is doped so as to form a conductive path between the conducting diaphragm 714 and an external circuit. A schematic view of test circuitry for this device is shown in FIG. 10, in which the device 710 is connected in series with an alternating current voltage source 720, a DC voltage source 721 and a series resistance 722. The output voltage across the device 710, $V_0$, is available for measurement across output terminals 723. The current supplied to the device may be measured by measuring the voltage across the resistor 722.

The AC voltage source 720 is a variable frequency oscillator which can be utilized to test the frequency response of the device 710. The direct current voltage source 721 is also preferably variable so as to allow various DC biasing voltages to be placed across the device 710 to determine the effect of various bias voltages. The resistor 722 is a variable resistor which is adjustable between a high resistance of at least a million ohms and a relatively low resistance of a few ohms, to allow simulation respectively of current source or voltage source excitation of the device.

Figure 11:
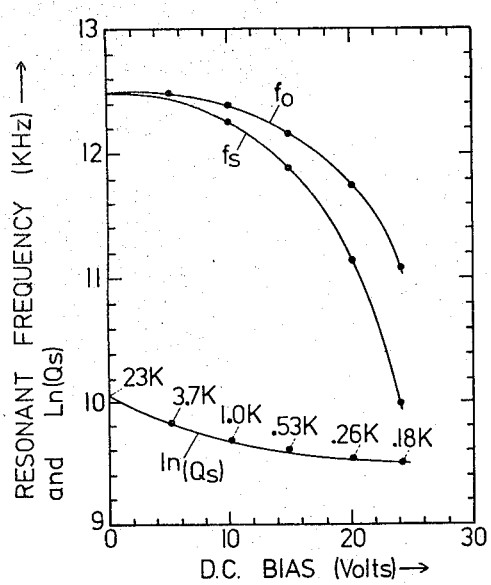
FIG. 11 is an illustrative graph showing the relationship between resonant frequency and quality factor versus bias voltage for the device of FIG. 7.
Figure 12:
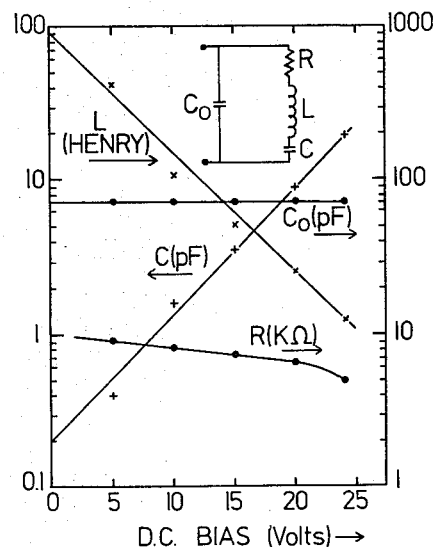
FIG. 12 is an illustrative graph showing the change in equivalent circuit parameters for the device of FIG. 7 as a function of bias voltage.

Results of tests conducted on the device 710 are shown in the graphs of FIGS. 11 and 12. FIG. 11 shows the change in series resonant frequency $f_s$, parallel resonant frequency $f_o$, and quality factor Q with changes in DC bias voltage. The test results indicate that the device may be considered to be the equivalent of a parallel connection of a capacitor with a series connected RLC circuit. The graphs shown in FIG. 12 illustrate the change in the effective value of the various components of this equivalent circuit with a change in DC bias voltage.

The data indicate that the unbiased membrane has a resonant frequency of approximately 12.5 kHz with a quality factor of 23,000. The device 710 thus may be utilized as a sharply tuned band-pass filter for oscillator applications, with the filter being tunable depending on the DC bias applied to the device.

The existence and frequency of a resonance in the silicon membranes is determined in substantial part by the tension applied to the membrane, and by the thickness and lateral dimensions of the membrane. As an approximation, a square membrane may be analogized to a damped spring-mass system, in which case the fundamental resonant frequency is approximately given by the equation:

$$f_r = \frac{1}{2\pi a}\left(\frac{6T}{\rho t}\right)^{\frac{1}{2}}$$

where
T = tension in the membrane
a = lateral dimension of membrane
t = thickness of membrane
$\rho$ = density of membrane Similar results are obtained for substantially circular membranes where the lateral dimension is the diameter of the membrane. Membranes having a desired resonant frequency may thus be produced by controlling the tension, lateral dimensions, and thickness of the membrane. Membranes having a strong structure can be produced in accordance with the invention in thicknesses from approximately 1 to 10 microns, with resonances of interest being obtained with diaphragm lateral dimensions in the range of 1 millimeter to 2 centimeters. At these dimensions, the membrane is in a state of tension similar to a drum head. Stable membranes have been produced having internal tensions measured on the order of magnitude of $10^5$ dynes per centimeter.

Although, as stated above, the membranes formed in accordance with the invention are not limited to membranes formed by boron diffusion, such a process has been shown to be highly desirable. In accordance with the invention, diffusion of boron into the crystalline silicon substrate is accomplished in two distinct procedures, a deposition diffusion in a first furnace and a drive diffusion in a second furnace. This bifurcated procedure enables the formation of membranes in silicon substrates without introducing such high impurity levels in the entire substrate that additional circuitry cannot be formed on it.

Silicon wafers having parallel faces of (100) crystal orientation, which may include either N or P background impurities at net doping levels below $10^{18}$ per cubic centimeter, are cleaned initially by using a xylene, acetone, and trichloroethylene mixture. Wafers cleaned by this mixture are then rinsed sequentially in sulfuric acid, hydrofluoric acid, and a mixture of hydrogen peroxide and ammonium hydroxide.

The cleaned wafers are then oxidized at approximately 1050° C. for 4 hours in an ambient gas comprising a mixture of oxygen and water vapor to form an oxide layer on both surfaces of the substrate. Portions of the surfaces of the oxide coated substrate are masked to leave open and unshielded those areas in which the oxide is to be removed. An oxide solvent is then applied to the coated wafers to remove the unmasked oxide, after which the wafers are cleaned to remove the photo resist and any residual solvent.

The deposition diffusion is performed in a deposition furnace at temperatures between 850° C. and 1250° C. in an ambient deposition gas, liquid or solid. Typical flow rates of ambient gases are 420 cubic centimeters (cc) per minute of $B_2H_6$ at 5,000 parts per million in argon, 75 cc per minute of oxygen and 9,000 cc per minute of nitrogen. Boron may be provided from other sources such as boron tribromide and boron trichloride. The length of time which the silicon substrates remain in the deposition furnace will affect the depth of the deposition diffusion, and typical diffusion times are in the range of 20 to 90 minutes. After this period of time, the exposed surface of the substrate has a boron "skin" with very high surface boron atom concentrations and relatively shallow depth. This boron skin will typically include a layer in the range of 3,000 Ångstroms to 8,000 Ångstroms of heavily boron doped silicon (greater than $10^{21}$ boron atoms per cubic centimeter and up to approximately $10^{23}$ per cubic centimeter) covered by a thin layer (approximately 1,300 Ångstroms or less) of boro-silicate glass. The thickness of the boro-silicate glass layer is observed to increase with increases in the time that the silicon substrate remains in the deposition furnace. Relatively short deposition times minimize the thickness of this boro-silicate glass layer. In general, it is preferred that the deposition diffusion time not exceed approximately 90 minutes so that the thickness of the boro-silicate glass does not exceed acceptable levels. Auger analysis of samples of silicon substrates prepared in the oxidizing ambient of the deposition furnace indicate that there is also a very thin layer (in the range of 100 Ångstroms) of boron oxide formed on the surface of the boro-silicate glass.

We have determined that the thickness and structure of the boro-silicate glass is critical to the proper construction of thin membranes in silicon substrates. Long deposition times increase the thickness of the boro-silicate glass and result in the glass layer dominating the underlying boron doped silicon in determining the tension placed on the resulting membrane. The glass layer and the boron doped silicon layer have different coefficients of thermal expansion, with the result that during cool down of the substrate, the differing contraction rates of the two layers may cause the membrane to buckle or crack. We have also determined that the boro-silicate glass layer readily absorbs water vapor from the atmosphere and in doing so, the glass layer is densified and made structurally stronger. The strain exerted on the substrate by a tough boro-silicate glass layer will affect the proper etching of a uniform membrane on the opposite side of the substrate because of the differences in the strain field between the boro-silicate glass layer and the underlying doped silicon layer. Therefore, typical prior procedures have required the removal of the glass layer from the silicon substrate before etching.

To substantially exclude absorption of water vapor by the silicon substrate in accordance with our invention, after completion of diffusion in the deposition furnace, the substrate is immediately transferred to the drive furnace. The drive furnace contains an ambient gas which is substantially oxygen and water vapor free, generally in the range of less than 5 parts per million of oxygen and less than 5 parts per million of water vapor. Nitrogen gas is preferably used as the drive ambient, which is maintained at temperatures between approximately 950° C. to 1250° C. It is preferred that the transfer of the substrate from the deposition furnace to the drive furnace be accomplished in an enclosed fixture having a nitrogen gas ambient with less than 5 parts per million of both water vapor and oxygen, and that the drive furnace itself be flushed with nitrogen gas for an hour before insertion of the substrates to minimize to the practical extent possible the residual oxygen and water vapor within the drive furnace.

The drive diffusion takes place over a time period of approximately 0.1 hour to 4 hours, the time of drive determining the thickness of the resulting membrane in combination with the initial thickness and boron atom density of the deposition diffusion layer. Generally, diaphragms in thickness ranges from a few tenths of a micron to several microns in thickness may be produced in accordance with this procedure. Structurally stable diaphragms can be formed in thicknesses from 1 to 10 microns in practical diffusion times with control of thicknesses to 0.1 micron. It has been observed that the relatively thin boro-silicate glass layer on the substrate does not interfere with the formation of the membrane in the substrate, and does not have to be removed before etching of the cavity which defines the membrane. If absorption of water vapor by the boro-silicate glass is substantially excluded, it has been observed that the glass layer will shatter and weaken structurally during the drive diffusion and subsequent cool-down such that it exerts little or no strain on the underlying boron doped silicon layer.

After the drive diffusion has been accomplished, the substrates are rapidly cooled down and the side of the substrate opposite to the boron diffused layer is masked with a photo-resist to expose a selected area of silicon at a portion of the surface having selected lateral dimensions. The oxide in the areas not covered by the photo-resist is removed by applying oxide etchant to the substrate, and the substrate is then cleaned. The cleaned substrate is immediately inserted into a silicon etchant such as hydrazine, with the etching continuing until the etch self-terminates on the heavily boron doped layer.

The thickness and lateral dimensions of the resulting membranes can be controlled by varying the conditions under which the diffusion is performed. The cross-sectional areas are determined primarily by the patterns which define the exposed windows in the silicon dioxide film covering the substrate. The thickness of the membrane is controlled by: (1) the deposition diffusion conditions of gas flow rates, temperature, and time; (2) the drive diffusion conditions of gas flow rates, temperature, and time; and (3) the strain at the interface between the doped silicon membrane and the glass layer, which is controlled by the temperature of the drive diffusion and the cooling rate. The tension in the membrane may be controlled by adjusting the factors which influence the thickness of the membrane as well as utilizing an additional anneal cycle in nitrogen or other forming gas at temperatures below drive diffusion temperatures.

Figure 9:
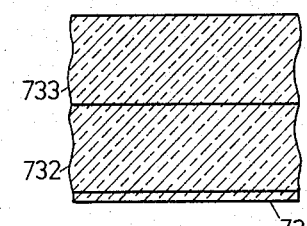
FIG. 9 is an expanded cross-sectional view taken along the line 9—9 of FIG. 7.

Utilizing our procedure for forming membranes in silicon substrates, it is not necessary to remove the boro-silicate glass from the finished membrane, although it can be done if desired. The structure resulting from the processing steps described above can be illustrated with reference to FIG. 9, which is a partial cross-section of the membrane 714 shown in FIG. 7. Auger analysis of the samples after diffusion and etching indicates that three distinct layers are present. The outer most layer 731 consists of approximately 100 Angstroms of boron oxide. This is followed by a second layer 732 of several hundred Ångstroms (approximately 1,300 Ångstroms) of boro-silicate glass. The third layer 733 is a silicon-boron surface phase with a thickness varying with processing conditions. The third layer has a very high boron atom concentration (in the range of $10^{23}$ atoms per cubic centimeter) near the interface between the layers 732 and 733, followed by a plateau region in which the boron concentration is above the solubility limit of boron in silicon (greater than $2 \times 10^{20}$ per cubic centimeter). Near the back edge of the layer 733, the boron concentration drops fairly abruptly to levels at which the boron can be accommodated substitutionally in the silicon lattice (approximately less than $2 \times 10^{20}$ atoms per cubic centimeter). The silicon etchant terminates at this drop off in boron concentration to define the membrane. In the remainder of the substrate, the diffusion has continued into the substrate at normal boron doped silicon levels, i.e., less than approximately $2 \times 10^{20}$ atoms per cubic centimeter. Generally, it is preferred that boron not be diffused into a surface of the silicon substrate substantially beyond the areas in which the membranes are to be formed so that the remainder of the silicon substrate is in good condition for formation of circuits on the substrate.

The resulting membrane may consist of all three of the layers, or layer 733 alone, and in any case is relatively strong mechanically and has high conductivity, with typical sheet resistance in the range of 1 to 10 ohms per square.

It is understood that the invention is not confined to the particular embodiments set forth herein as illustrative, but rather embraces all such modified forms thereof as come within the scope of the following claims.

We claim:

1. A process for producing mechanically stable thin membranes in a crystalline silicon substrate suitable for incorporation in integrated circuits, comprising the steps of:
   (a) diffusing boron into one of the opposite sides of a silicon substrate in a deposition furnace for a period of time not greater than approximately 90 minutes, with the boron being supplied in an amount sufficient and at a temperature sufficient to form a layer in the silicon substrate having boron atom concentrations greater than $10^{21}$ per cubic centimeter;
   (b) transferring the diffused silicon substrate from the deposition furnace to a drive furnace while substantially excluding absorption of water vapor by the silicon substrate;
   (c) heating the substrate in the drive furnace in an ambient gas which is substantially oxygen and water vapor free for a selected period of time at a temperature sufficient to drive the diffused boron to a desired depth in the silicon substrate;
   (d) masking the side of the substrate opposite to the boron diffused layer to expose a selected area of silicon at a portion of the surface having selected lateral dimensions; and
   (e) applying a silicon etchant to the exposed unmasked surface area until sufficient silicon is dissolved to expose the diffused boron layer and be retarded from further etching thereby, the exposed portion of the etchant resistant layer thereby forming a thin membrane.

2. The process of claim 1 wherein the silicon substrate is selected such that the parallel faces of the substrate are oriented in (100) crystal directions.

3. The process of claim 1 including before the step of diffusing boron in the deposition furnace, the steps comprising:
cleaning the silicon substrate with an organic solvent selected from the group consisting of xylene, acetone, and trichloroethylene, and mixtures thereof;
the clean substrate then being treated with an inorganic cleaning agent selected from the group consisting of sulfuric acid, hydrofluoric acid, and a mixture of hydrogen peroxide and ammonium hydroxide;
the treated substrates then being oxidized in an ambient gas comprising a mixture of oxygen and water to form an oxide layer on both surfaces of the substrate;
masking portions of the surfaces of the oxide coated substrate to leave open desired areas in which the oxide is to be removed;
applying an oxide etchant to the masked surface to remove the oxide layer leaving an exposed portion of the substrate into which boron can be diffused.

4. The process of claim 1 wherein the etchants used to etch the silicon are selected from the group consisting of hydrazine, potassium hydroxide, and a mixture of ethylene diamine, water, and pyrocatechol.

5. The process of claim 1 wherein the step of diffusing boron into one of the sides of the silicon substrate is achieved by placing the substrate in an atmosphere comprising $B_2H_6$, oxygen, and nitrogen.

6. The process of claim 5 wherein the deposition diffusion atmosphere gases are supplied at flow rates of approximately 420 cubic centimeters per minute of $B_2H_6$ at 5,000 parts per million in argon, 75 cubic centimeters per minute of $O_2$, and 9,000 cubic centimeters per minute of $N_2$.

7. The process of claim 1 wherein the step of transferring the diffused silicon substrate from the deposition furnace to the drive furnace is accomplished in an atmosphere consisting essentially of nitrogen with less than 5 parts per million each of water and oxygen.

8. The process of claim 1 wherein the ambient atmosphere of the drive furnace consists essentially of nitrogen with less than 5 parts per million of oxygen and less than 5 parts per million of water vapor.

9. The process of claim 1 wherein the step of diffusing boron into the substrate is performed for a period of time in the range of 20 minutes to 90 minutes at an ambient temperature in the range of 850° C. to 1250° C.

10. The process of claim 1 wherein the step of heating the substrate in a drive furnace is performed for a period of time in the range of 0.1 hour to 4 hours at an ambient temperature in the range of 950° C. to 1250° C.

* * * * *